(12) United States Patent
Oka et al.

(10) Patent No.: US 12,295,189 B2
(45) Date of Patent: May 6, 2025

(54) LIGHT-EMITTING DEVICE

(71) Applicant: NICHIA CORPORATION, Anan (JP)

(72) Inventors: Yuta Oka, Awa (JP); Nami Abe, Tokushima (JP)

(73) Assignee: NICHIA CORPORATION, Anan (JP)

( * ) Notice: Subject to any disclaimer, the term of this patent is extended or adjusted under 35 U.S.C. 154(b) by 240 days.

(21) Appl. No.: 18/174,490

(22) Filed: Feb. 24, 2023

(65) Prior Publication Data

US 2023/0223502 A1 Jul. 13, 2023

Related U.S. Application Data

(63) Continuation of application No. 17/385,900, filed on Jul. 26, 2021, now Pat. No. 11,710,810, which is a
(Continued)

(30) Foreign Application Priority Data

Aug. 28, 2017 (JP) ................. 2017-163346

(51) Int. Cl.
*H01L 25/07* (2006.01)
*H01L 25/075* (2006.01)
(Continued)

(52) U.S. Cl.
CPC ..... *H10H 20/8514* (2025.01); *H01L 25/0753* (2013.01); *H10H 20/852* (2025.01);
(Continued)

(58) Field of Classification Search
CPC ... H01L 33/505; H01L 25/0753; H01L 33/52; H10H 20/8514; H10H 20/852; H10H 20/853; H10H 20/856
See application file for complete search history.

(56) References Cited

U.S. PATENT DOCUMENTS 8,163,580 B2   4/2012   Daschner et al.
2010/0264438 A1  10/2010  Suenaga
(Continued)

FOREIGN PATENT DOCUMENTS

JP   2012-199218 A   10/2012
JP   2012-243822 A   12/2012
(Continued)

OTHER PUBLICATIONS

Restriction Requirement in the related U.S. Appl. No. 16/112,143, dated Oct. 29, 2019.
(Continued)

*Primary Examiner* — Mounir S Amer
*Assistant Examiner* — Alexander Belousov
(74) *Attorney, Agent, or Firm* — Global IP Counselors, LLP

(57) ABSTRACT

A light-emitting device includes a plurality of light-emitting elements, a plurality of light-transmissive members, a covering member, and a plurality of pairs of electrodes. The light-emitting elements are arranged in a plurality of columns and a plurality of rows. The covering member integrally covers lateral surfaces of the light-emitting elements. The pairs of electrodes are arranged at a lower surface of the light-emitting device. The pairs of electrodes include first and second pairs of electrodes aligned along a column direction so that the electrodes of the same polarity among the first and second pairs of electrodes are aligned along the column direction, and a third pair of electrodes arranged adjacent to the first pair of electrodes in a row direction so that one of the third pair of electrodes and one of the first pair of electrodes facing each other in the row direction have the same polarity.

19 Claims, 10 Drawing Sheets

Related U.S. Application Data continuation of application No. 16/112,143, filed on Aug. 24, 2018, now Pat. No. 11,152,546.

(51) Int. Cl.

| | | |
|---|---|---|
| *H10H 20/851* | (2025.01) | |
| *H10H 20/852* | (2025.01) | |
| *H10H 20/853* | (2025.01) | |
| *H10H 20/856* | (2025.01) | |
| *H01L 25/16* | (2023.01) | |
| *H10H 20/825* | (2025.01) | |
| *H10H 20/831* | (2025.01) | |
| *H10H 20/84* | (2025.01) | |
| *H10H 20/85* | (2025.01) | |
| *H10H 20/854* | (2025.01) | |
| *H10H 20/857* | (2025.01) | |

(52) U.S. Cl.
CPC ........ *H10H 20/853* (2025.01); *H10H 20/856* (2025.01); *H01L 25/167* (2013.01); *H10H 20/825* (2025.01); *H10H 20/831* (2025.01); *H10H 20/84* (2025.01); *H10H 20/8506* (2025.01); *H10H 20/8513* (2025.01); *H10H 20/854* (2025.01); *H10H 20/857* (2025.01)

(56) References Cited

U.S. PATENT DOCUMENTS

| | | | |
|---|---|---|---|
| 2013/0001605 A1 | 1/2013 | Ishihara et al. | |
| 2013/0141013 A1 | 6/2013 | Kodama et al. | |
| 2015/0076529 A1* | 3/2015 | Wang | H01L 24/96 |
| | | | 438/27 |
| 2015/0340574 A1* | 11/2015 | Tamaki | H01L 33/507 |
| | | | 438/27 |
| 2016/0079486 A1 | 3/2016 | Sugimoto et al. | |
| 2016/0148912 A1 | 5/2016 | Higashino | |
| 2017/0062681 A1 | 3/2017 | Miyoshi et al. | |
| 2017/0155022 A1 | 6/2017 | Tomonari et al. | |
| 2017/0365746 A1 | 12/2017 | Vampola et al. | |
| 2018/0277716 A1 | 9/2018 | Huang et al. | |

FOREIGN PATENT DOCUMENTS

| | | | |
|---|---|---|---|
| JP | 2013-016588 A | 1/2013 | |
| JP | 2015-056650 A | 3/2015 | |
| JP | 2015-126209 A | 7/2015 | |
| JP | 2016-058447 A | 4/2016 | |
| JP | 2016-100457 A | 5/2016 | |
| JP | 2016-115729 A | 6/2016 | |
| JP | 2017-050359 A | 3/2017 | |
| JP | 2017-108091 A | 6/2017 | |
| JP | 2010-272847 A | 12/2020 | |
| WO | 2014/171277 A1 | 10/2014 | |

OTHER PUBLICATIONS

Non-Final Office Action in the related U.S. Appl. No. 16/112,143, dated Apr. 30, 2020.
Final Office Action in the related U.S. Appl. No. 16/112,143, dated Oct. 26, 2020.
Advisory Action in the related U.S. Appl. No. 16/112,143, dated Dec. 28, 2020.
Notice of Allowance in the related U.S. Appl. No. 16/112,143, dated May 17, 2021.
Non-Final Office Action in the related U.S. Appl. No. 17/385,900, filed Nov. 16, 2022.

* cited by examiner

LIGHT-EMITTING DEVICE

CROSS-REFERENCE TO RELATED APPLICATION

This application is a continuation application of U.S. patent application Ser. No. 17/385,900, filed on Jul. 26, 2021, which is a continuation application of U.S. patent application Ser. No. 16/112,143, filed on Aug. 24, 2018, now U.S. Pat. No. 11,152,546. This application claims priority to Japanese Patent Application No. 2017-163346 filed on Aug. 28, 2017. The entire disclosures of U.S. patent application Ser. Nos. 16/112,143 and 17/385,900, and Japanese Patent Application No. 2017-163346 are hereby incorporated herein by reference.

BACKGROUND OF THE INVENTION

1. Field of the Invention

The present disclosure relates to a light-emitting device.

2. Description of Related Art

Various light sources have been used for electronic apparatus and the like. Light source devices employing light-emitting diodes in which light-emitting elements and wavelength conversion substances are combined have been used in recent years.

In the case where such light source devices are used for some applications such as light sources of flashes for cameras, colors of light emitted from a plurality of light source devices are mixed to reproduce white light, and there is a demand that the light source devices have uniform and high luminance (for example, see U.S. Pat. No. 8,163,580).

SUMMARY OF THE INVENTION

In the case where a plurality of light-emitting devices are arranged, certain intervals between the light-emitting devices are required in order to ensure precision in mounting, so that a region between the light-emitting devices may not have a sufficient luminance, and unevenness in luminance may occur.

The present invention has been made in view of problems as described above, and one object thereof is to provide a light-emitting device that can achieve improvement in luminance and reduction in unevenness in luminance.

According to one embodiment of the present invention, a light-emitting device includes a plurality of light-emitting elements, a plurality of light-transmissive members, a covering member, and a plurality of pairs of electrodes. The light-emitting elements each has a light-extracting surface. The light-emitting elements are arranged in a plurality of columns and a plurality of rows. The light-transmissive members each has an upper surface and a lower surface opposite to the upper surface. The lower surface faces the light-extracting surface of at least one of the light-emitting elements. The covering member integrally covers lateral surfaces of the light-emitting elements. The pairs of electrodes are arranged at a lower surface of the light-emitting device. Each of the pairs of electrodes is electrically connected to at least one of the light-emitting elements. The pairs of electrodes include a first pair of electrodes and a second pair of electrodes aligned along a column direction so that the electrodes of the same polarity among the first pair of electrodes and the second pair of electrodes are aligned along the column direction, and a third pair of electrodes arranged adjacent to the first pair of electrodes in a row direction so that one of the third pair of electrodes and one of the first pair of electrodes facing each other in the row direction have the same polarity.

The light-emitting device according to the above described embodiment can achieve improvement in luminance and reduction in unevenness in luminance.

DETAILED DESCRIPTION OF EMBODIMENTS

Figure 1A:
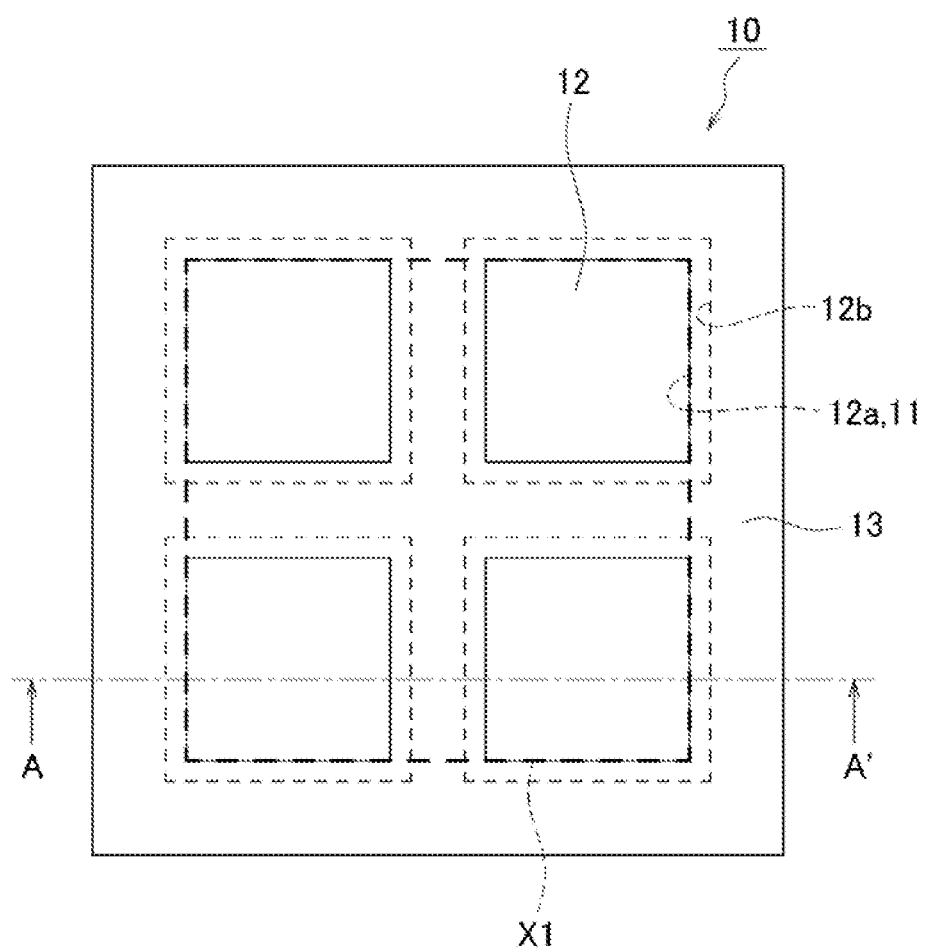
FIG. 1A is a schematic top plan view of a light-emitting device according to a first embodiment.

The following describes embodiments of the present invention in detail with reference to the accompanying drawings. The descriptions below include terms (such as "up", "down", "right", "left", and other terms inclusive of these terms) indicating specific directions or positions as appropriate. These terms are used to facilitate understanding of the invention with reference to the drawings, and these terms do not limit the technical scope of the present invention. Portions indicated by the same reference numeral in different drawings represent the same portion or member.

As shown in, for example, FIGS. 1A to 1E, a light-emitting device 10 according to certain embodiments of the present invention includes light-emitting elements 11, light-transmissive members 12, and a covering member 13.

In particular, in the light-emitting device 10, upper surfaces 12a of the light-transmissive members 12 constitutes a light-emitting portion, and the perimeter (i.e., the dotted line in FIG. 1A indicated by X1) of the light-emitting portion forms a square shape or a circular shape.

With this structure of the light-emitting device including a plurality of light-emitting elements, unevenness in luminance due to gaps between the light-emitting elements can be effectively prevented, and luminance can be improved. Further, the external appearance or look of the light-emitting device viewed from the light-extracting surface can be also improved.

Light-Emitting Elements 11

For example, semiconductor light-emitting elements such as light-emitting diodes can be used for the light-emitting elements 11. Each of the light-emitting elements includes a layered structure including a semiconductor layer. The layered structure may include a sapphire substrate or a light-transmissive growth substrate made of a semiconductor material (such as a nitride semiconductor material) that transmits light emitted from the layered structure, or the growth substrate may be removed from the layered structure to expose the semiconductor layer. The layered structure includes a plurality of semiconductor layers such as an n-type semiconductor layer, a light-emitting layer (i.e., active layer), and a p-type semiconductor layer. Examples of the material for the semiconductor layers include semiconductor materials such as group III-V compound semiconductors and group II-VI compound semiconductors. More specifically, a nitride semiconductor material such as $In_xAl_yGa_{1-x-y}N$ ($0 \leq X$, $0 \leq Y$, $X+Y \leq 1$) can be used.

The light-emitting element 11 includes a plurality of electrodes 11a and 11b connected to the layered structure. The plurality of electrodes 11a and 11b are preferably connected to the same surface of the layered structure but may be connected to different surfaces. Each of the plurality of electrodes 11a and 11b may have a single-layer structure or a layered structure as long as the electrodes have ohmic contact with the layered structure so that their current-voltage characteristics are linear or substantially linear. Such electrodes can be made of a material and can have a structure known in the field of the invention with any appropriate thickness. For example, the thickness of the electrodes is preferably a dozen to three hundred micrometers. For the electrodes, a good electrical conductor, preferably a metal such as Cu, can be used. The shape of the electrodes can be selected from various shapes in accordance with the purpose and the intended use. The plurality of electrodes of the light-emitting element may have the same shape or different shapes.

In the case where the plurality of electrodes are disposed on the same surface of the layered structure, the surface of the layered structure on which the electrodes are not disposed serves as the upper surface of the light-emitting element, and the surface of the layered structure on which the electrodes are disposed serves as the lower surface. The upper surface of the light-emitting element serves as the light-extracting surface.

Figure 1C:
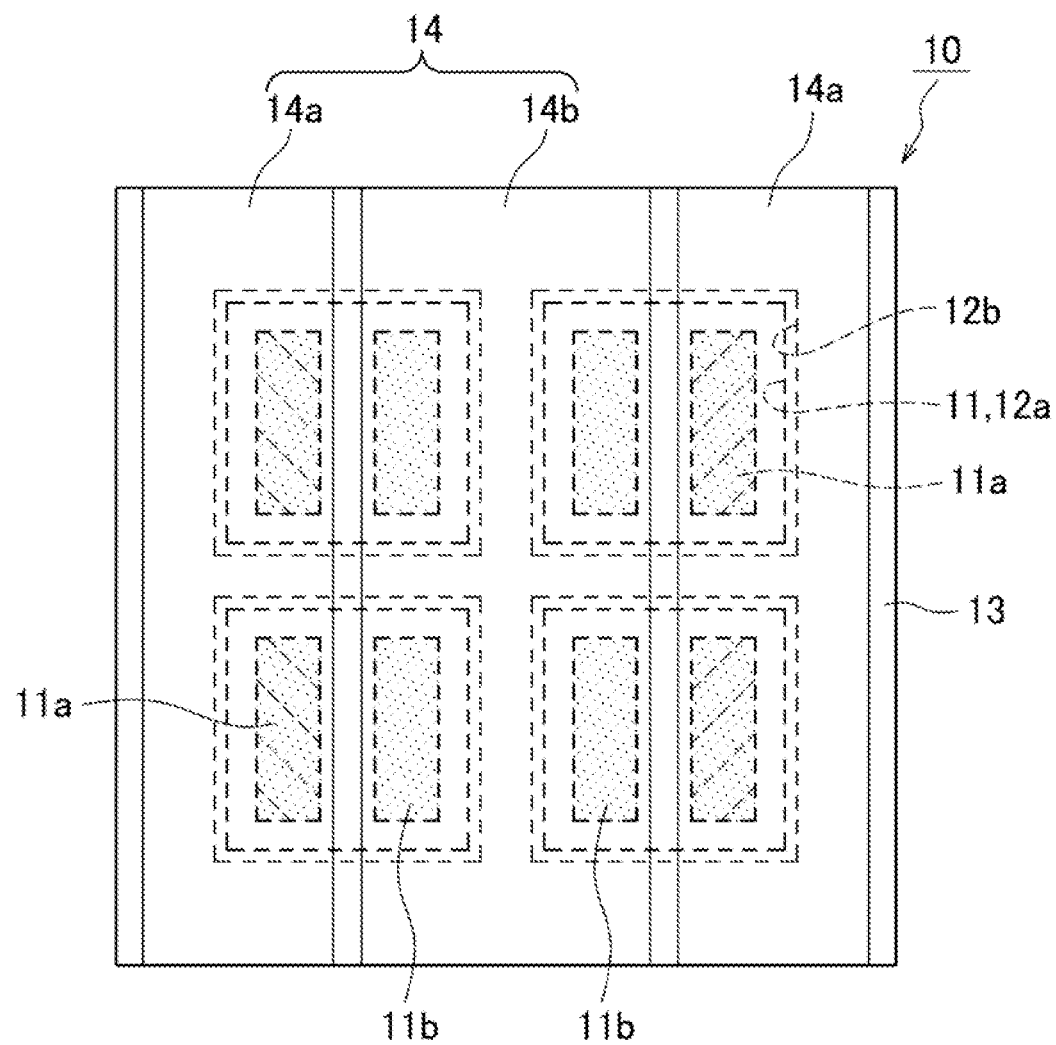
FIG. 1C is a schematic bottom plan view of the light-emitting device according to the first embodiment.
Figure 1D:
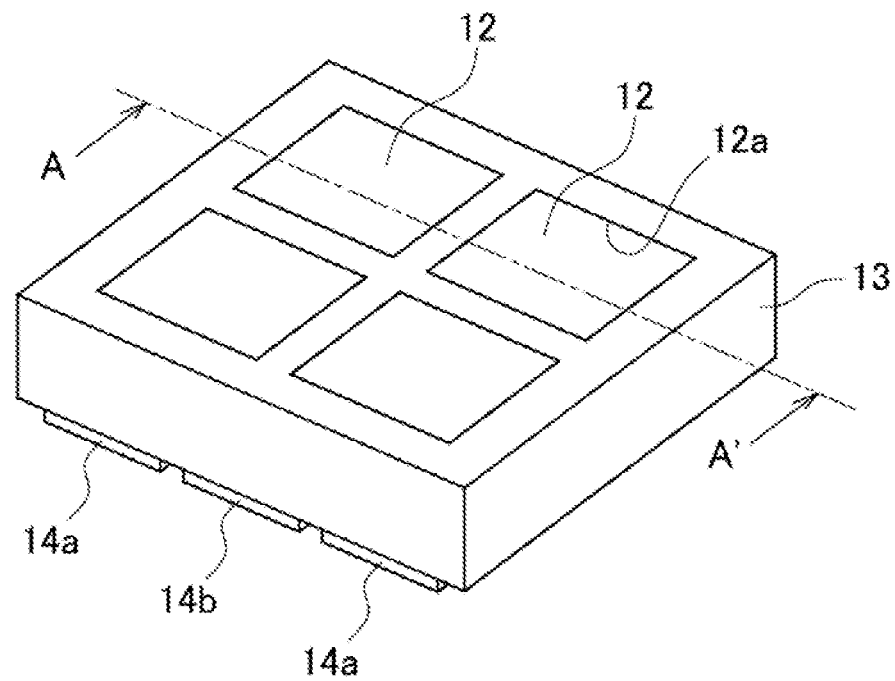
FIG. 1D is a schematic perspective view of the light-emitting device according to the first embodiment when viewed from above.
Figure 2A:
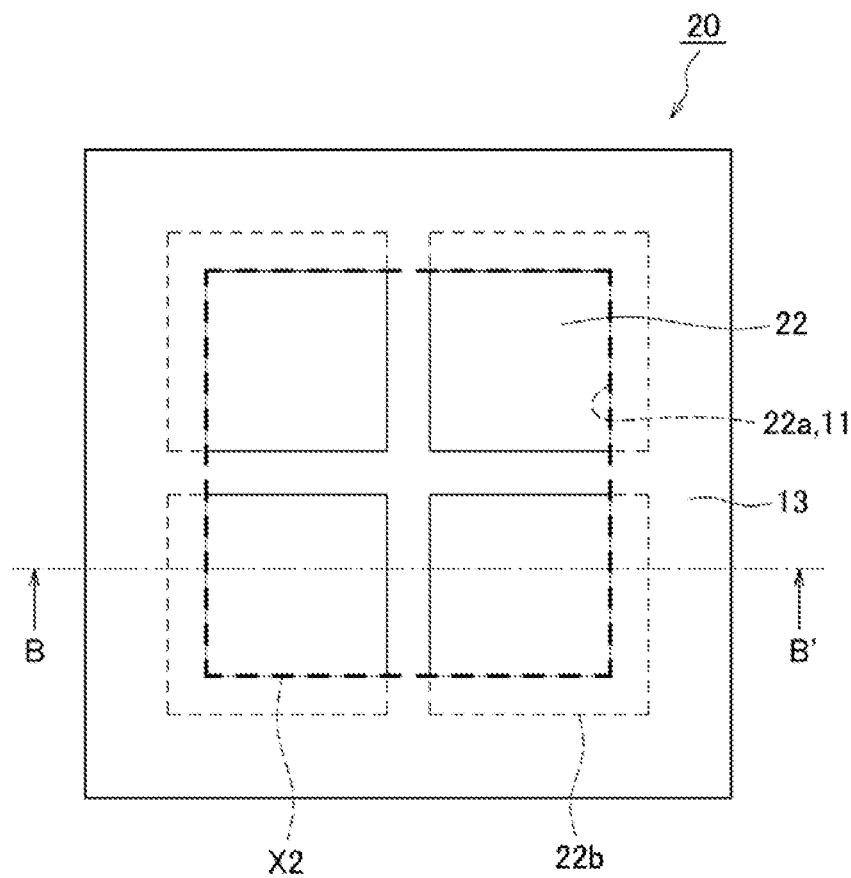
FIG. 2A is a schematic top plan view of a light-emitting device according to a second embodiment.
Figure 3:
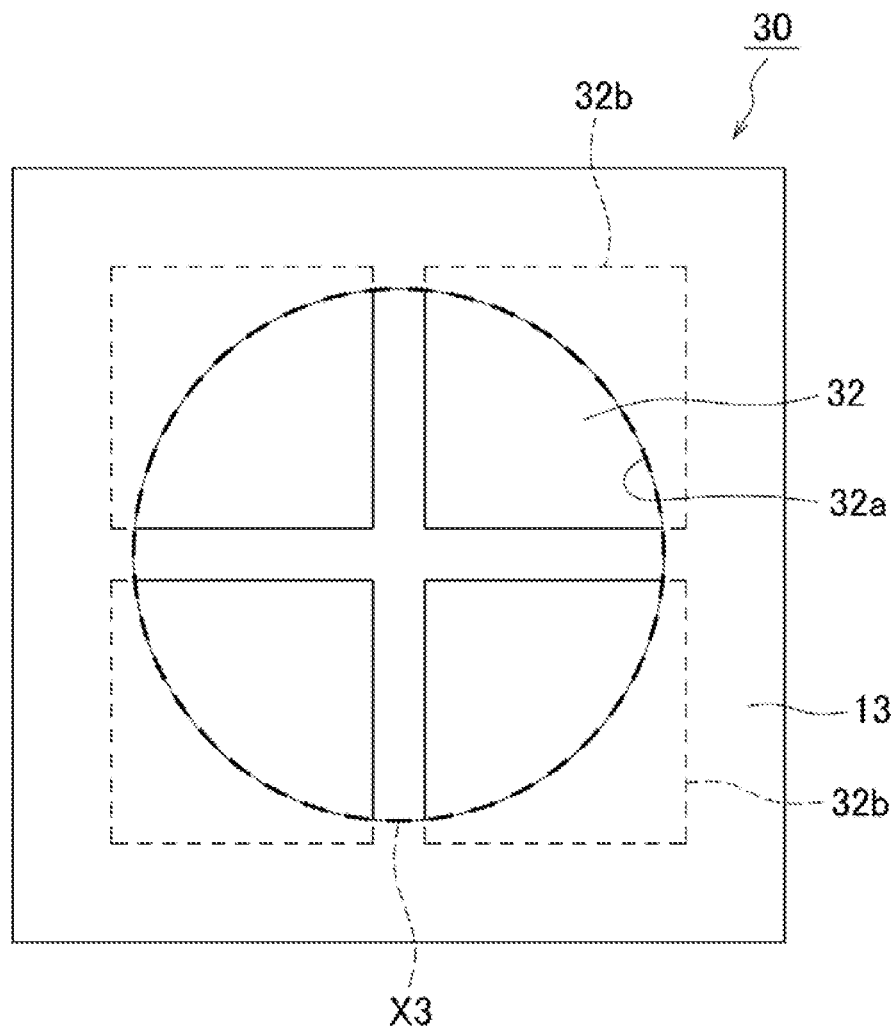
FIG. 3 is a schematic top plan view of a light-emitting device according to a third embodiment.
Figure 4A:
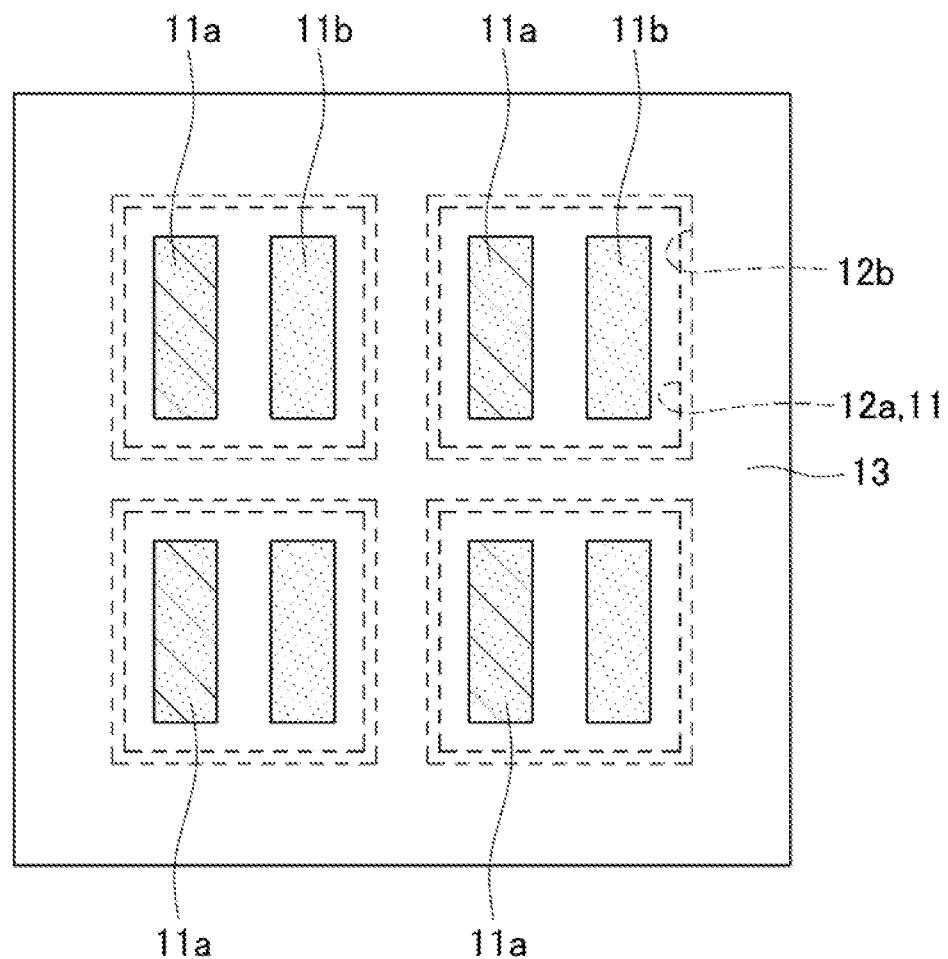
FIG. 4A is an illustrative schematic bottom plan view of a light-emitting device according to one embodiment.
Figure 4B:
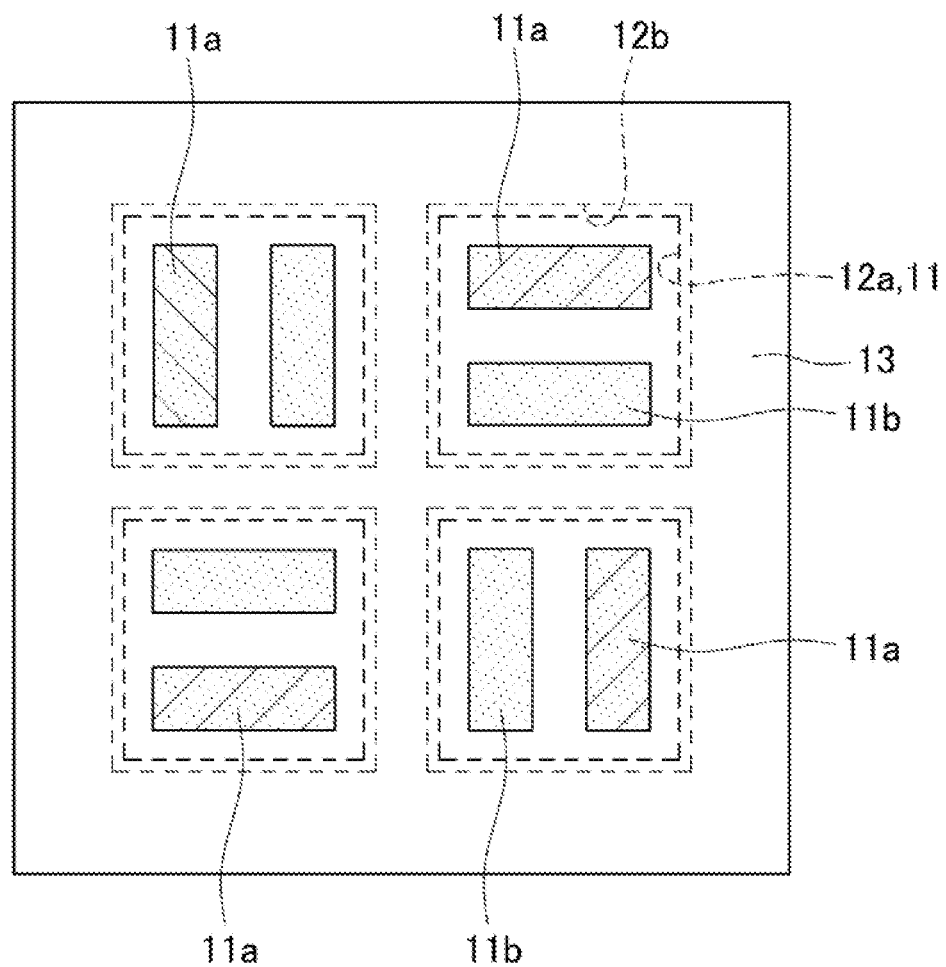
FIG. 4B is an illustrative schematic bottom plan view of a light-emitting device according to another embodiment.

In the case where a plurality of light-emitting elements 11 are arranged in the light-emitting device, such as the case where four light-emitting elements 11 are arranged, the light-emitting elements 11 may be arranged in two rows and two columns as shown in FIGS. 1A, 2A and 3. In the case where the light-emitting elements 11 are arranged in two rows and two columns, examples of arrangements of the electrodes 11a and 11b include: an arrangement in which the electrodes 11a and 11b extend along the column direction with the electrodes of the same polarity being aligned along the column direction, while the two columns have opposite polarity arrangements as shown in FIG. 1C; an arrangement in which the electrodes 11a and 11b extend along the column direction with the electrodes of the same polarity being aligned along the column direction, while the two columns have the same polarity arrangement so that the electrodes having different polarities are alternately aligned along the row direction as shown in FIG. 4A; and an arrangement in which the pairs of electrodes 11a and 11b of adjacent ones of the light-emitting elements 11 in respective row or column are rotated by 90° in the a single direction as shown in FIG. 4B.

The wavelengths of the light-emitting elements can be appropriately selected in accordance with characteristics of the light-emitting device to be obtained. For example, the wavelengths of the light-emitting elements can be in a range of 400 nm to 700 nm. A single light-emitting device may include two or three light-emitting elements, preferably includes four or more light-emitting elements, and may include six light-emitting elements. Among these cases, the number of light-emitting elements is preferably even, and is more preferably four or six.

The light-emitting elements 11 can have various shapes in a top view such as circles, ellipses, or polygons such as quadrilaterals or hexagons.

The light-emitting elements 11 preferably has a quadrilateral shape in a top view, and more preferably has a square shape or a substantially square shape. In the specification of the present application, the expression "substantially square" refers to a quadrilateral shape in which difference between lengths of long sides and short sides is in a range of approximately ±10%. In a single light-emitting device, a plurality of light-emitting elements are preferably arranged such that the outermost periphery of the light-emitting elements has a quadrilateral shape, more preferably a square shape or a substantially square shape. For example, it is preferable that two light-emitting elements 11 having a rectangular shape in a plan view be aligned in the short-side direction. In the case where four light-emitting elements 11 having a square shape in a plan view are used, two light-emitting elements 11 are preferably aligned in each of the longitudinal and lateral directions. These arrangements allows for improving the external appearance of the light-emitting device when viewed from the light-extracting surface.

Light-Transmissive Members 12

The light-transmissive members 12 are disposed on the light-extracting surfaces of the light-emitting elements and transmit light emitted from the light-emitting elements to allow the light to be emitted to the outside. The light-transmissive members 12 preferably cover at least the entirety of the light-extracting surfaces of the light-emitting elements. For example, each of the light-transmissive members 12 preferably has the same size as the light-extracting surface of a corresponding one of light-emitting element, but variations in size of approximately ±10% are acceptable.

An outermost shape of the light-transmissive member 12 can have various shapes in a plan view such as a circular shape, an ellipse shape, and a polygonal shape such as a quadrilateral shape. Among these shapes, a square shape or a substantially square shape is preferable. This structure allows for improving the external appearance of the light-emitting device when viewed from the light-extracting surface, in particular, the external appearance of the plurality of light-transmissive members described below.

Each of the light-transmissive members 12 has a lower surface 12b facing the light-extracting surface of at least one of the light-emitting elements, and the upper surface 12a opposite to the lower surface 12b.

Figure 5A:
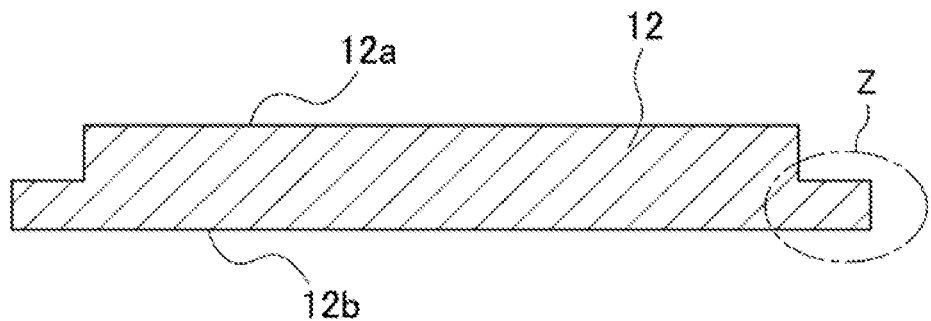
FIG. 5A is an illustrative schematic cross-sectional view of a light-transmissive member employed for a light-emitting device according to one embodiment.

The upper surface 12a of each of the light-transmissive members 12 preferably has an area smaller than an area of the lower surface 12b. For example, each of the light-transmissive members 12 may have lateral surfaces inclined toward the inner side of the light-transmissive member 12 along the direction toward the upper surface 12a, or may have stepped lateral surfaces with a shape similar to a shape of a stack of two members. In other words, the light-transmissive member 12 preferably has projecting portions Z laterally protruding from the lateral surfaces as shown in FIG. 5A and other drawings. Each of the projecting portions Z preferably has a lower surface, a surface perpendicular to or inclined with respect to the lower surface and in contact with the lower surface, and a surface in contact with the surface perpendicular to or inclined with respect to the lower surface and being parallel to the upper surface 12a of the light-transmissive member 12. The lower surface of each projecting portion Z in this case is preferably in the same plane with the lower surface 12b of the light-transmissive member 12. In particular, it is preferable that the lateral surfaces has the projecting portions. The projecting portions may be disposed on the entirety of lateral surfaces of the light-transmissive member 12 or may be disposed only on some of the lateral surfaces.

The difference between an area of the upper surface 12a and an area of the lower surface 12b is preferably such that, for example, the area of the upper surface 12a is 98% or less, more preferably 95% or less, further preferably 93% or less, of the area of the lower surface 12b. Also, the area of the upper surface 12a is preferably 80% or more, more preferably 82% or more, and further more preferably 85% or more of the lower surface 12b. In particular, at least a part of a periphery of the upper surface 12a of the light-transmissive member 12 preferably coincides with at least a part of a periphery of the light-emitting element 11 in a plan view. This structure allows for improving the light extraction efficiency. Meanwhile, at least a part of the periphery of the lower surface 12b of the light-transmissive member 12 may coincide with at least a part of the periphery of the light-emitting element 11 in a plan view. This structure allows for reducing leakage of light and further improving the light extraction efficiency through the upper surface 12a, so that the luminance can be improved.

The projecting portions of the light-transmissive member 12 can be formed by selecting an appropriate tool angle and an appropriate width of a dicing blade when the light-transmissive member is separated by dicing. The projecting portions may also be formed by using half-dicing as a method for dicing. By using such a method of forming the projecting portions, the light-transmissive member 12 having an integrated structure as a whole that includes a single wavelength conversion member as described below can be formed as shown in FIG. 5A.

In each of the light-transmissive member 12, the shape of the upper surface 12a may be the same as, in other words, similar to, or may be different from the shape of the lower surface 12b. For example, in the case where the lower surface 12b has a square shape in a plan view, the upper surface 12a may have a square, circular, elliptic, or fan shape. Regardless of whether the shapes of the upper surface 12a and the lower surface 12b are the same or different, the centers or the centroids of the shapes may or may not correspond to each other.

The upper surfaces 12a of the plurality of light-transmissive members 12 may have the same shape, or some or all of the upper surfaces 12a of the plurality of light-transmissive members 12 may have different shapes. The lower surfaces 12b of the plurality of light-transmissive members 12 may have the same shape, or some or all of the lower surfaces 12b of the plurality of light-transmissive members 12 may have different shapes. Whether the shapes are the same or different, all the upper surfaces 12a preferably have the same area. This structure allows for effectively reducing unevenness in luminance.

The upper surfaces 12a of the light-transmissive members 12 collectively constitute the light-emitting part of the light-emitting device. In other words, light emitted from the light-emitting elements is emitted only through the upper surfaces 12a. Accordingly, in the light-emitting device, the upper surfaces of a plurality of light-transmissive members collectively constitute the light-emitting part. The outermost periphery of the light-emitting part can have various shapes in accordance with the shapes of the upper surfaces 12a of the light-transmissive members. Among various shapes, the outermost periphery of the light-emitting part collectively constituted by the upper surfaces 12a preferably has a square shape or a circular shape. For example, four light-transmissive members, each of which has an upper surface of a fan shape, and four light-emitting elements are arranged such that the four fan shapes are combined together to form a circular shape, so that a light-emitting part having a circular shape in a plan view can be obtained (see, FIG. 3). In a similar manner, four light-transmissive members, each of which has an upper surface of a square shape, and four light-emitting elements are arranged such that the four square shapes are combined together to form a square shape, so that a light-emitting part having a square shape in a plan view can be obtained (see, FIGS. 1A and 2A). Such shapes enable a plurality of emitting surfaces to be close to one another, which allows for improving the luminance of the light-emitting part, reducing the unevenness in luminance, and improving the external appearance of the light-transmissive members when viewed from the light-extracting surfaces.

For example, the light-transmissive members are preferably disposed at intervals of 0.2 mm or more. With intervals equal to or more than a certain value, light emitted from a specific light-emitting element and passing through the covering member 13 described below can be prevented from entering a light-transmissive member other than the light-transmissive member connected to the upper surface of the specific light-emitting element, so that mixing of emission colors can be prevented. The light-transmissive members are preferably arranged at larger intervals therebetween, but if intervals between the light-transmissive members are too large, the size of the light-emitting device needs to be increased.

Accordingly, the light-transmissive members are preferably arranged at an interval that allows for preventing mixing of emission colors.

The upper and lower surfaces 12a and 12b of the light-transmissive members 12 may each have irregularities but are preferably flat.

It is more preferable that the upper and lower surfaces 12a and 12b be parallel to each other. It is preferable that each of the light-transmissive members 12 be arranged corresponding to a respective one of the light-emitting elements 11.

The light-transmissive members 12 may contain a wavelength conversion substance. The wavelength conversion substance may constitute the light-transmissive members in the form of, for example, materials cut out of a phosphor ingot such as single crystal phosphors, polycrystalline phosphors, and a sintered body made of phosphorous powder.

The light-transmissive members 12 may further contain light-transmissive resin as a binding agent.

Examples of the wavelength conversion substance include substances that can be excited by light emitted from the light-emitting elements. Examples of wavelength conversion substances that can be excited by blue or ultraviolet light-emitting elements include cerium-activated yttrium-aluminum-garnet phosphors (YAG:Ce); cerium-activated lutetium-aluminum-garnet phosphors (LAG:Ce); europium- and/or chromium-activated nitrogen-containing calcium aluminosilicate phosphors ($CaO-Al_2O_3-SiO_2$); europium-activated silicate phosphors $((Sr,Ba)_2SiO_4)$; nitride phosphors such as β-SiAlON phosphors, CASN phosphors, and SCASN phosphors; KSF phosphors ($K_2SiF_6$:Mn); sulfide phosphors; and quantum-dot phosphors. Combinations of such wavelength conversion substances and blue or ultraviolet light-emitting elements allows for manufacturing light-emitting devices configure to emit various colors, such as a light-emitting device configured to emit white light.

The light-transmissive members 12 may be substantially free of wavelength conversion substance. In this case, light emitted from the light-emitting elements is directly transmitted without being subjected to wavelength conversion. For example, with the use of light-emitting elements that respectively emit red, blue, and green light, mixing these emission colors allows for emitting white light.

The light-transmissive members may also contain various fillers for the purpose of, for example, adjusting the viscosity.

Figure 5B:
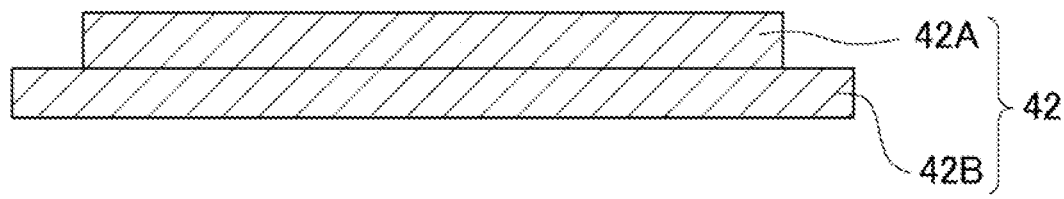
FIG. 5B is an illustrative schematic cross-sectional view of a light-transmissive member employed in a light-emitting device according to another embodiment.
Figure 5C:
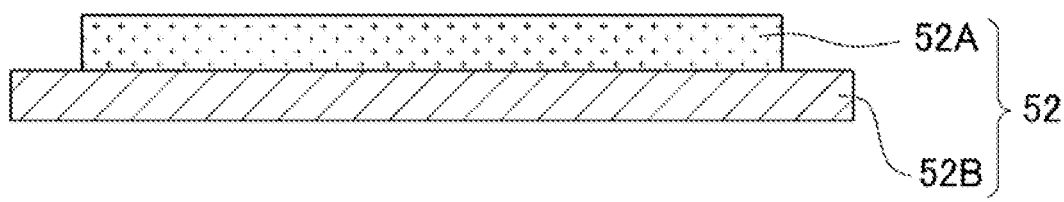
FIG. 5C is an illustrative schematic cross-sectional view of a light-transmissive member employed for a light-emitting device according to even another embodiment.
Figure 5D:
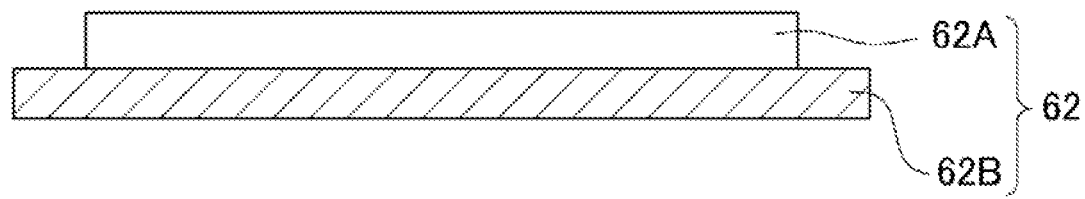
FIG. 5D is an illustrative schematic cross-sectional view of a light-transmissive member employed for a light-emitting device according to still another embodiment.

Each of the light-transmissive members of any of the first to third embodiments described below may have a layered structure as long as the light-transmissive members are light-transmissive. For example, as in a light-transmissive member 42 shown in FIG. 5B, a layered structure in which a first layer 42A and a second layer 42B, which are plate-shaped bodies having different sizes and containing the same wavelength conversion substance, are layered may be employed. A thickness of the first layer 42A and a thickness of a second layer 42B may be different or the same. Alternatively, for example, as in a light-transmissive member 52 shown in FIG. 5C, a layered structure in which the first layer 52A and the second layer 52B that contain different wavelength conversion substances are layered may be employed; as in a light-transmissive member 62 shown in FIG. 5D, a layered structure in which the first layer 62A that contains a wavelength conversion substance and the second layer 62B that does not contain a wavelength conversion substance but contains a filler are layered may be employed; or a layered structure in which such layers are alternately layered may be employed. In the plurality of light-transmissive members of a single light-emitting device, one or more of the plurality of light-transmissive members may contain a wavelength conversion member with a composition (more specifically, type and/or amount) different from the others of the plurality of light-transmissive members. The plurality of light-transmissive members 12 may include the same number of first light-transmissive members and second light-transmissive members that contain a wavelength conversion member with compositions that are different between the first and the second light-transmissive members but are the same among the first light-transmissive members and among the second light-transmissive members. In particular, wavelength conversion members that provide different emission colors are preferably used.

A light-transmissive resin, glass, a ceramic, or the like can be used for a material of the light-transmissive resin. In particular, a light-transmissive resin is preferably used, and examples thereof include thermosetting resins such as silicone resins, modified silicone resins, epoxy resins, and phenolic resins, and thermoplastic resins such as polycarbonate resins, acrylic resins, methylpentene resin, and polynorbornene resin. A silicone resin, which has good resistance to light and heat, is particularly preferable.

The light-transmissive members 12 may be connected to the light-emitting elements 11 using a known method such as compression, sintering, and bonding with the use of an adhesive.

Covering Member 13

The covering member 13 integrally covers the lateral surfaces of the light-emitting elements 11 and the lateral surfaces of the light-transmissive members 12. In particular, the upper surface of the covering member 13 is preferably in the same plane with the upper surfaces 12a of the light-transmissive members 12. The covering member 13 having such a structure can block light traveling toward the lateral surfaces of the light-emitting elements and the lateral surfaces of the light-transmissive members, which can prevent the light distribution from being broad, so that light with good visibility and high luminance can be obtained. Further, preventing the light distribution from being broad allows for, in the case where optical components such as lenses and reflectors are used, miniaturizing the optical components. The expression "good visibility" as used herein refers to that the boundary between the light-emitting portion and the non-light-emitting portion is clear. The greater the difference in luminance between the light-emitting region and the non-light-emitting region is, the better the visibility is.

The plurality of electrodes are exposed from the covering member 13 at the lower surfaces of the light-emitting elements 11, and the covering member 13 preferably covers the lower surface of the layered structure constituting each of the light-emitting elements. With this structure, a portion of light traveling toward the lower surfaces of the light-emitting elements 11 can be reflected and extracted. In this case, a surface of the covering member 13 covering the lower surface of the layered structure is preferably in the same plane with a surface of each of the plurality of electrodes. This structure allows for reducing leakage of light from the light-emitting elements and thus allows for improving the light extraction efficiency.

The covering member 13 is preferably a resin member containing a thermosetting resin such as a silicone resin, a modified silicone resin, an epoxy resin, or a phenolic resin as a main component, more preferably a light-reflective resin member. The "light-reflective resin" refers to a resin material that has a reflectance with respect to light emitted from the light-emitting elements of 70% or more. For example, a white resin is preferable. With a white resin, light that has reached the covering member is reflected toward the light-extracting surface of each of the light-emitting elements, so that the light extraction efficiency of the light-emitting device can be enhanced.

For example, a light-transmissive resin in which a light-reflective substance is dispersed can be used for the light-reflective resin. For the light-reflective substance, titanium oxide, silicon oxide, zirconium oxide, potassium titanate, aluminum oxide, aluminum nitride, boron nitride, mullite, or the like is preferably used. A light-reflective substance in a form of particles, fibers, flakes, or the like can be used. In particular, with a fibrous light-reflective substance, an effect of reducing the thermal expansion coefficient of the covering member can also be expected, and thus a fibrous light-reflective substance is preferably used.

An amount of light reflected, transmitted, etc., by the covering member 13 can be changed by changing the content of the light-reflective substance or the like and/or a thickness of the covering member. Accordingly, the content of the light-reflective substance or the like and/or a thickness of the covering member can be appropriately adjusted according to properties of the light-emitting device to be obtained. For example, the content of the light-reflective substance is preferably 30 wt % or more with respect to the total weight of the covering member. For example, a portion of the covering member constituting an outer portion of the light-emitting device has a thickness (indicated by M in FIG. 1B) in a range of 50 μm to 500 μm, and a portion of the covering member between light-emitting elements has a thickness (indicated by Q in FIG. 1B) in a range of 100 μm to 1000 μm. A portion of the covering member between upper surfaces of light-transmissive members 12 has a thickness (indicated by W in FIG. 1B) has a thickness, for example, similar to Q, that is, in a range of 100 μm to 1000 μm.

The covering member 13 can be molded using, for example, an injection molding method, a potting method, a resin printing method, a transfer molding method, a compression molding method, or a stereoscopic printing method.

Figure 6:
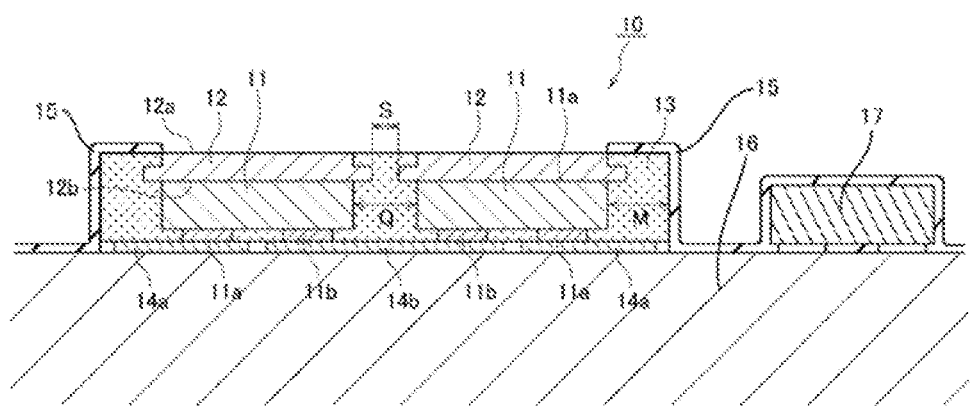
FIG. 6 is a schematic cross-sectional view of showing an example when the light-emitting device according to the first embodiment is mounted on a mounting board.

Also, for example, as shown in FIG. 6, when the light-emitting device 10 (or the light-emitting device 20 or 30) is mounted on a mounting board 16, a resist 15 having a color that is the same as or similar to the color of a wavelength conversion member contained in the light-transmissive members 12 may be disposed using a stereoscopic printing method on a region of the surface of the covering member 13 surrounding the light-transmissive members 12 in a plan view of the light-emitting device, which allows the boundaries between the covering member 13 and the light-transmissive members 12 to be less noticeable. At this time, a surface of another electronic component 17 mounted on the mounting board 16 and a surface of the mounting board 16 may be integrally covered with the resist 15.

Metal Layer

The light-emitting device preferably includes a plurality of metal layers 14 that cover a surface of the covering member 13 at a side opposite to the light-extracting surface of each of the light-emitting elements 11, in other words, at the lower surface side, and that are connected to the plurality of electrodes. For example, it is preferable that the plurality of metal layers 14 include a first metal layer 14a and a second metal layer 14b, and electrodes of the plurality of light-emitting elements with one polarity are connected to the first metal layer 14a, and electrodes of the plurality of light-emitting elements with the other polarity are connected to a second metal layer 14b. The first metal layer 14a and the second metal layer 14b are connected to the electrodes of the light-emitting elements and thus can function as external connecting terminals of the light-emitting device. The first metal layer 14a and/or the second metal layer 14b can also function as alignment parts for alignment with reference to the sizes, shapes, and positions at which they are formed.

Each of the plurality of metal layers 14 preferably has a size equal to or larger than the area of corresponding ones of the electrodes of the light-emitting elements 11. The first metal layer 14a and the second metal layer 14b preferably have substantially the same size and the same shape. For example, the first metal layer 14a and the second metal layer 14b can have a shape of a polygon such as triangles, pentagons, hexagons, or quadrilaterals such as squares and rectangles, a shape formed by cutting off a portion of such a polygon, or a shape formed by rounding off a portion of such a polygon.

It is preferable that a shape of the first metal layer 14a and a shape of the second metal layer 14b are bilaterally symmetrical. One of the first metal layer 14a and the second metal layer 14b may include a portion that is cut off to indicate the polarity. Various shapes can be employed in accordance with the shape of the electrodes of the light-emitting elements.

A distance between the first metal layer 14a and the second metal layer 14b is preferably large enough to prevent short circuits due to spread of bonding members such as solder when the metal layer is bonded to a circuit board or the like on which the light-emitting device is to be mounted. The distance between the first metal layer 14a and the second metal layer 14b is preferably 20 μm or more, more preferably 50 μm or more.

The metal layer is preferably made of a material having good corrosion resistance and oxidation resistance than those of the electrodes. For example, the outermost layer of the metal layer is preferably made of a platinum-group metal such as Au or Pt. In the case where the metal layer covers a surface of the light-emitting device to be soldered, Au, which has good solderability, is preferably used for the outermost surface of the metal layer. The metal layer may be constituted by only one layer made of a single material, or may have a layered structure in which layers of different materials are layered. In particular, a metal material having a high melting point is preferably used for the metal layer, and examples of such a metal material include Ru, Mo, and Ta. Also, such a metal having a high melting point disposed between the outermost layer and the electrodes of the light-emitting elements can serve as a diffusion preventing layer that can reduce diffusion of Sn contained in a solder into the electrodes and layers near the electrodes. Examples of a layered structure of the metal layer including such a diffusion preventing layer include Ni/Ru/Au and Ti/Pt/Au. The diffusion preventing layer (such as Ru) has a thickness, for example, in a range of 1 nm to 100 nm.

The metal layer can have any appropriate thickness. The metal layer can have a thickness that allows for selectively occurring laser ablation and is, for example, preferably 1 μm or less, more preferably 100 nm or less. Further, the metal layer preferably has a thickness of the metal layer that allows for reducing corrosion of the electrodes, such as 5 nm or more. In the case where a plurality of layers constitute the metal layer, the thickness of the metal layer as used herein refers to the total thickness of the layers.

The metal layer may include one first metal layer 14a and one second metal layer 14b, or, for example, at least two first metal layers 14a separate from each other may be disposed on both sides of the second metal layer 14b (for example, as in the arrangement of the electrodes 11a and 11b as shown in FIG. 1C).

Alternatively, two or more first metal layers 14a and two or more second metal layers 14b may be alternately disposed (for example, as in the arrangement of the electrodes 11a and 11b as shown in FIG. 4A). The shapes, sizes, and the like are preferably changed as appropriate in accordance with the arrangement of the electrodes 11a and 11b and the like as shown in FIG. 4B.

The metal layer can be formed by sputtering, vacuum evaporation, atomic layer deposition (ALD), metal organic chemical vapor deposition (MOCVD), plasma-enhanced chemical vapor deposition (PECVD), atmospheric-pressure plasma-enhanced chemical vapor deposition, plating, or the like.

Protective Element

The light-emitting device may include a protective element in addition to the light-emitting elements 11. With the protective element, the light-emitting device can be protected against breakdowns of the light-emitting elements and degradation of performance due to application of excessive voltages. For the protective element, any appropriate protective element may be used, and any known element may be used. The protective element is preferably embedded in the covering member 13.

First Embodiment

The light-emitting device 10 according to a first embodiment includes the light-emitting elements 11, the light-transmissive members 12, and the covering member 13 as shown in FIG. 1A to FIG. 1E.

Each of the light-emitting elements 11 has a layered structure including a semiconductor layer, the plurality of electrodes 11a and 11b connected to a surface of the layered structure. Further, an upper surface of each of the light-emitting elements 11, that is, a surface of each of the light-emitting elements 11 on which the plurality of electrodes 11a and 11b are not disposed, serves as a light-extracting surface. In the present embodiment, four square-shaped light-emitting elements 11 are arranged in two rows and two columns. The distance (indicated by Q in FIG. 1B) between the light-emitting elements in this case is 600 μm.

Each of the light-transmissive members 12 has a lower surface 12b having a square shape and facing the light-extracting surface of the light-emitting element 11, and a square upper surface 12a opposite to the lower surface 12b. The upper surface 12a and the lower surface 12b are parallel to each other, and the centers of the upper and lower surfaces 12a and 12b coincide with each other. A single light-transmissive member 12 is disposed with respect to each of the light-emitting elements 11. In the present embodiment, four light-transmissive members 12 each having a square shape are disposed.

The periphery of the upper surface 12a of each light-transmissive member 12 coincides with the outer periphery of the corresponding light-emitting element 11 in a plan view.

The light-transmissive member 12 contains a wavelength conversion substance and a light-transmissive resin, such as a silicone resin. For example, in two of the plurality of light-transmissive members (first light-transmissive members) vertically or laterally aligned, the wavelength conversion substance is a yellow or red phosphor, the content of which is 30% to 80% of the total weight of the light-transmissive member 12 and in other two of the plurality of light-transmissive members (second light-transmissive members) vertically or laterally aligned, the wavelength conversion substance is a yellow phosphor, the content of which is 0.01% to 80% of the total weight of the light-transmissive member 12. In this structure, white light emitted from the first light-transmissive members has a color temperature lower than the color temperature of white light emitted from the second light-transmissive members.

Figure 1B:
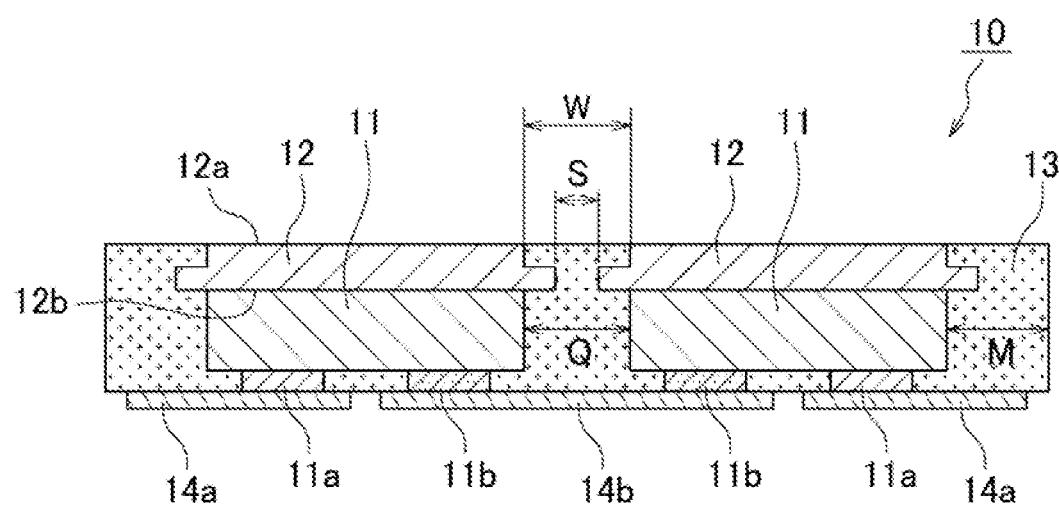
FIG. 1B is a schematic cross-sectional view taken along a line A-A' in FIG. 1A.

In each of the light-transmissive members 12, the upper surface 12a has an area smaller than an area of the lower surface 12b as shown in FIG. 1B.

In the present embodiment, the upper surface 12a has an area approximately 20% smaller than an area of the lower surface 12b. To achieve such a difference in area, the light-transmissive member 12 has the projecting portions Z laterally protruding from the lateral surfaces as shown in FIG. 1B and FIG. 5A. A length of the projecting portions Z is, for example, in a range of 20 μm to 100 μm. Each of the projecting portions Z has a perpendicular surface perpendicular to the lower surface 12b and in contact with the lower surface 12b, and a surface in contact with the perpendicular surface and parallel to the upper surface 12a of the light-transmissive member 12. The distance between the projecting portions Z of adjacent light-transmissive members 12 (indicated by S in FIG. 1B) is 500 The upper surfaces 12a of the light-transmissive members 12 constitutes the light-emitting portion as shown in FIG. 1A, and the outermost periphery of the light-emitting portion (X1 in FIG. 1A) has a square shape.

The covering member 13 integrally covers the lateral surfaces of the light-emitting elements 11 and the lateral surfaces of the light-transmissive members 12. The covering member 13 is also disposed on the surface on which the pairs of electrodes 11a and 11b of the light-emitting elements 11 are disposed so as not to cover the plurality of electrodes 11a and 11b. The upper surface of the covering member 13 is in the same plane with the upper surfaces 12a of the light-transmissive members 12. The lower surface of the covering member 13 is in the same plane with the lower surfaces of the electrodes 11a and 11b.

The covering member 13 contains a light-reflective substance and a light-transmissive resin. The light-transmissive resin is a silicone resin, and the light-reflective substance is titanium oxide. The content of titanium oxide is 40% of the total weight of the covering member 13.

In the present embodiment, a portion of the covering member 13 between the light-emitting elements 11 has a thickness Q of 600 and a portion of the covering member 13 at an outside of the light-emitting elements 11 has a thickness M of 150 μm.

Figure 1E:
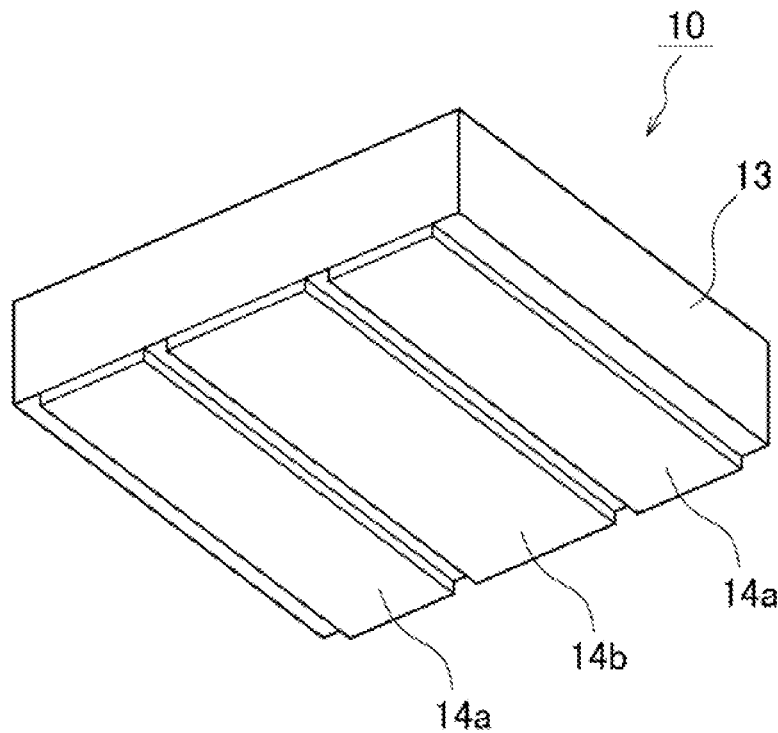
FIG. 1E is a schematic perspective view of the light-emitting device according to the first embodiment when viewed from below.

As shown in FIGS. 1C and 1E, the light-emitting device 10 includes the first metal layers 14a and the second metal layer 14b in a plan view, which are a plurality of metal layers covering a surface of the covering member 13 at a lower side of the light-emitting elements 11, being connected to the plurality of electrodes 11a and 11b, and functioning as external terminals. For example, in a plan view, two separated first metal layers 14a are disposed on both sides of the light-emitting device 10 such that the second metal layer 14b is disposed therebetween. The first metal layers 14a and the second metal layer 14b are arranged with a distance therebetween that allows for preventing short circuits due to spread of bonding members such as solder when the metal layer is bonded to a circuit board or the like on which the light-emitting device is to be mounted. For example, a distance between the first metal layers 14a and the second metal layer 14b is 30 Each of the first metal layers 14 and the second metal layer 14b is connected to a corresponding one of the electrodes 11a or 11b of the light-emitting elements 11. In the present embodiment, the first metal layers 14a and the second metal layer 14b have approximately the same size, are disposed along a side of the light-emitting device 10, and each have a rectangular shape in a plan view.

Each of the first metal layers 14a and the second metal layer 14b has a layered structure of Ni/Ru/Au from the electrodes 11a and 11b side of the light-emitting elements 11, and have a total thickness of 500 Å.

In the light-emitting device including a plurality of light-emitting elements, in the case where two of the four light-transmissive members serve as the first light-transmissive members and the other two serve as the second light-transmissive members as described above, the structure in which the first light-transmissive members and the second light-transmissive members contains wavelength conversion substances with compositions different between the first and second light-transmissive members and the upper surfaces of the first light-transmissive members and the upper surfaces of the second light-transmissive members constitutes the light-emitting part having the periphery X1 with a square shape allows for effectively reducing unevenness in luminance attributable to gaps between the light-emitting elements and improving luminance. The external appearance of the light-emitting device viewed from the light-extracting surface can be also improved.

Second Embodiment

Figure 2B:
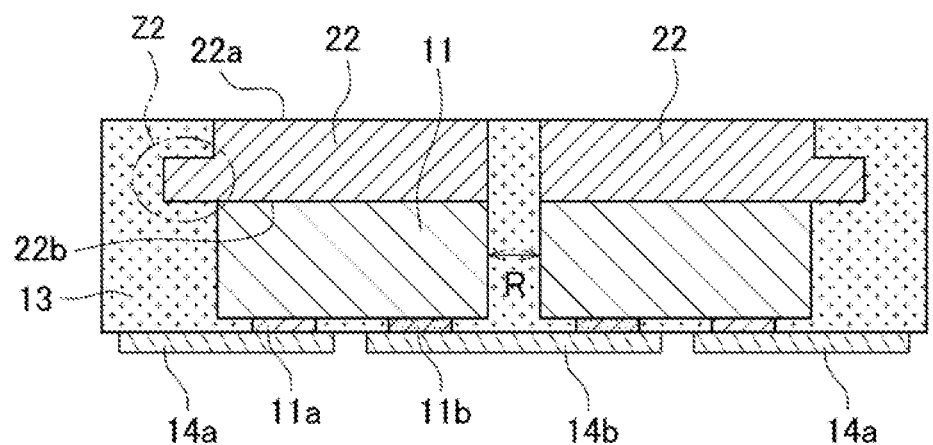
FIG. 2B is a schematic cross-sectional view taken along a line B-B' in FIG. 2A.

In a light-emitting device 20 according to a second embodiment, each of light-transmissive members 22 has a square shape in a plan view, and also has an upper surface 22a and a lower surface 22b having square shapes in a plan view. The difference between an area of the upper surface 22a and the lower surface 22b similar to that in each of the light-transmissive members in the first embodiment. As shown in FIGS. 2A and 2B, the center of the upper surface 22a is shifted from the center of the lower surface 22b, and two sides of the square upper surface 22a overlap two sides of the lower surface 22b. Accordingly, projecting portions Z2 are disposed substantially along two sides of the light-transmissive member 22 in a plan view.

The light-transmissive members 22 are disposed such that the two sides of the upper surface 22a of each of the light-transmissive members 22 that coincide with two sides of the lower surface 22b thereof face the center of the light-emitting device 20 in a top view. A distance R between the light-emitting elements 11 in this case is 100 μm.

Accordingly, although the areas of the light-extracting surfaces of the light-emitting elements 11 are the same as those in the first embodiment, the area of the light-emitting part surrounded by a periphery X2 can be reduced, so that the luminance can be further improved and unevenness in luminance can be prevented.

Other configurations in the second embodiment is substantially the same as those of the light-emitting device 10 according to the first embodiment, and substantially the same effects can be obtained.

Third Embodiment

In a light-emitting device 30 according to a third embodiment, each of light-transmissive members 32 has a square shape in a plan view, and has a lower surface 32b having a square shape and an upper surface 32a having a fan shape in a plan view as shown in FIG. 3. The difference in area between the upper and lower surfaces 32a and 32b of each of the light-transmissive members 32 is similar to that in each of the light-transmissive members 12 according to the first embodiment, and the two adjacent straight sides of the fan-shaped upper surface 32a overlap two of the sides of the lower surface 32b. Thus, a projecting portion is located at a region substantially other than the two sides of the light-transmissive member 32 in a plan view.

Each of the light-transmissive members 32 is disposed such that the two straight sides of the upper surface 32a and two sides of the lower surface 32b that coincide with the two straight sides of the upper surface 32a in a plan view face the center of the light-emitting device 30. The distance between the light-emitting elements 11 in this structure is 100 μm.

Accordingly, in a plan view, an outermost periphery X3 of the light-emitting portions has a circular shape, and each of the light-emitting portions has an area a little smaller than the area of the light-extracting surface of a respective one of the light-emitting elements 11. This allows for further improving luminance and reducing unevenness in luminance.

Other configurations of the light-emitting device 30 is substantially the same as the structure of the light-emitting device 10 and 20 according to the first and second embodiment, respectively, and substantially the same effects can be obtained.

What is claimed is:

1. A light-emitting device comprising:
a plurality of light-emitting elements each having a light-extracting surface, the light-emitting elements are arranged in a plurality of columns and a plurality of rows;
a plurality of light-transmissive members each having an upper surface and a lower surface opposite to the upper surface, the lower surface facing the light-extracting surface of at least one of the light-emitting elements;
a covering member integrally covering lateral surfaces of the light-emitting elements; and
a plurality of pairs of electrodes arranged at a lower surface of the light-emitting device, each of the pairs of electrodes being electrically connected to at least one of the light-emitting elements, wherein
the plurality of pairs of electrodes include
a first pair of electrodes and a second pair of electrodes aligned along a column direction so that the electrodes of the same polarity among the first pair of electrodes and the second pair of electrodes are aligned along the column direction, and
a third pair of electrodes arranged adjacent to the first pair of electrodes in a row direction so that one of the third pair of electrodes and one of the first pair of electrodes facing each other in the row direction have the same polarity.

2. The light-emitting device according to claim 1, wherein the upper surface of each of the light-transmissive members collectively constitute a light-emitting part having an outermost periphery with a quadrilateral shape.

3. The light-emitting device according to claim 1, wherein in each of the light-transmissive members, the upper surface has an area smaller than an area of the lower surface.

4. The light-emitting device according to claim 1, wherein each of the light-transmissive members is disposed with respect to a respective one of the light-emitting elements.

5. The light-emitting device according to claim 1, wherein at least one of the light-transmissive members contains a wavelength conversion substance.

6. The light-emitting device according to claim 1, wherein
each of the light-transmissive members includes a first light-transmissive member and a second light-transmissive member, and
the first light-transmissive member contains a first wavelength conversion substance and the second light-transmissive member contains a second wavelength conversion substance having a different composition from the first wavelength conversion substance.

7. The light-emitting device according to claim 6, wherein an area of an upper surface of the first light-transmissive member is the same as an area of an upper surface of the second light-transmissive member.

8. The light-emitting device according to claim 1, wherein at least one of the light-transmissive members is substantially free of wavelength conversion substance.

9. The light-emitting device according to claim 1, wherein
each of the light-transmissive members has a projecting portion laterally protruding from at least one of the lateral surfaces of a corresponding one of the light-transmissive members, the projecting portion having
a perpendicular surface perpendicular to the lower surface of the corresponding one of the light-transmissive members and in contact with the lower surface, and
a surface in contact with the perpendicular surface and parallel to the upper surface of the corresponding one of the light-transmissive members.

10. The light-emitting device according to claim 1, wherein
the upper surface of each of the light-transmissive members is substantially flush with an upper surface of the covering member.

11. The light-emitting device according to claim 1, wherein
at least a part of an edge of the upper surface of each of the light-transmissive members coincides with at least a part of a periphery of a corresponding one of the light-emitting elements in a plan view.

12. The light-emitting device according to claim 1, wherein
at least a part of an edge of the lower surface of each of the light-transmissive members coincides with at least a part of a periphery of a corresponding one of the light-emitting elements in a plan view.

13. The light-emitting device according to claim 1, wherein
the covering member contains a light-reflective substance.

14. The light-emitting device according to claim 1, wherein
each of the light-transmissive members has a layered structure including a first layer and a second layer arranged over the first layer, with one of the first layer and the second layer containing a wavelength conversion substance, and with another one of the first layer and the second layer being free of a wavelength conversion substance.

15. The light-emitting device according to claim 14, wherein
at least a portion of the first layer protrudes laterally outwardly with respect to a lateral surface of the second layer.

16. The light-emitting device according to claim 1, wherein
each of the light-transmissive members has a layered structure including a first layer and a second layer arranged over the first layer, with the first layer containing a first wavelength conversion substance and the second layer containing a second wavelength conversion substance different from the first wavelength conversion substance.

17. The light-emitting device according to claim 1, wherein
each of the pairs of electrodes is electrically connected to at least one of the light-emitting elements so that the light-emitting device is configured to selectively define a light-emitting region and a non-light-emitting region, and to emit light only from the light-emitting region.

18. The light-emitting device according to claim 1, wherein
each of the light-emitting elements includes a semiconductor layer, and
each of the light-transmissive members is bonded to the semiconductor layer of a respective one of the light-emitting elements.

19. A camera flash comprising
the light-emitting device according to claim 1.

* * * * *